United States Patent
Ende et al.

(10) Patent No.: US 11,845,185 B2
(45) Date of Patent: Dec. 19, 2023

(54) DEVICE AND METHOD FOR THE ELECTRICAL TESTING OF AN ELECTRICAL COMPONENT

(71) Applicant: Franka Emika GmbH, Munich (DE)

(72) Inventors: Tobias Ende, Munich (DE); Michael Haas, Todtenweis-Sand (DE); Saskia Golz, Munich (DE); Sven Parusel, Munich (DE); Simon Haddadin, Munich (DE)

(73) Assignee: Franka Emika GmbH, Munich (DE)

( * ) Notice: Subject to any disclaimer, the term of this patent is extended or adjusted under 35 U.S.C. 154(b) by 1055 days.

(21) Appl. No.: 16/606,831

(22) PCT Filed: Apr. 18, 2018

(86) PCT No.: PCT/EP2018/059872
§ 371 (c)(1),
(2) Date: Oct. 21, 2019

(87) PCT Pub. No.: WO2018/197292
PCT Pub. Date: Nov. 1, 2018

(65) Prior Publication Data
US 2020/0039069 A1    Feb. 6, 2020

(30) Foreign Application Priority Data
Apr. 23, 2017   (DE) .................. 10 2017 003 901.1

(51) Int. Cl.
*B25J 9/16*   (2006.01)

(52) U.S. Cl.
CPC .......... *B25J 9/1633* (2013.01); *B25J 9/1679* (2013.01); *G05B 2219/39129* (2013.01); *G05B 2219/40082* (2013.01); *G05B 2219/45089* (2013.01)

(58) Field of Classification Search
CPC .................. B25J 9/1633; B25J 9/1679; G05B 2219/39129; G05B 2219/40082;
(Continued)

(56) References Cited

U.S. PATENT DOCUMENTS 6,507,185 B1 * 1/2003 Hennekes .......... G01R 31/2887
324/750.25
9,469,032 B2   10/2016 Zhang et al.
(Continued)

FOREIGN PATENT DOCUMENTS

CN       2379914 Y    5/2000
CN     101403829 A    4/2009
(Continued)

OTHER PUBLICATIONS

Sakakibara, S., "A two-armed intelligent robot assembles mini robots automatically", Industrial Electronics, Control and Instrumentation, 1996, Proceedings of the 1996 IEE IECON 22nd International conference on Taipei, Taiwan, vol. 3, Aug. 5, 1996, pp. 1879-1883.
(Continued)

*Primary Examiner* — Basil T. Jos
(74) *Attorney, Agent, or Firm* — Hoffmann & Baron, LLP

(57) ABSTRACT

A device and method for electrical testing of a component, the component including a contact point, wherein the device includes: an interface to provide the component; a robot manipulator having an effector configured to pick up, handle, and release the component; a receiving interface into which the component is insertable; a contacting device having a counter contact, the contacting device positioned in a first state so that the robot manipulator is able to insert/remove the component into/from the receiving interface, and positioned in a second state so that the counter contact is connected to the contact point of the component inserted into the receiving interface; an analysis unit connected to the
(Continued)

counter contact and configured to perform electrical testing of the component using connection of the counter contact and the contact point in the second state; and a control unit to control the robot manipulator and the contacting device.

14 Claims, 2 Drawing Sheets

(58) Field of Classification Search
CPC .......... G05B 2219/45089; G05B 2219/45063; G01R 31/2893; G01R 31/2867
See application file for complete search history.

(56) References Cited

U.S. PATENT DOCUMENTS

| | | | |
|---|---|---|---|
| 2004/0102862 | A1 | 5/2004 | Kato et al. |
| 2005/0168233 | A1 | 8/2005 | Roberts et al. |
| 2006/0279534 | A1 | 12/2006 | Powers et al. |
| 2008/0317575 | A1 | 12/2008 | Yamazaki et al. |
| 2009/0241047 | A1 | 9/2009 | Kuwahara et al. |
| 2010/0045360 | A1 | 2/2010 | Howard et al. |
| 2014/0253168 | A1 | 9/2014 | Choi et al. |
| 2014/0366646 | A1 | 12/2014 | Matsuzawa et al. |
| 2015/0053514 | A1 | 2/2015 | Unsin et al. |
| 2016/0306340 | A1 | 10/2016 | Nammoto et al. |
| 2017/0282367 | A1 | 10/2017 | Haddadin |

FOREIGN PATENT DOCUMENTS

| | | | |
|---|---|---|---|
| CN | 101783283 | A | 7/2010 |
| CN | 102288900 | A | 12/2011 |
| CN | 104412192 | A | 3/2015 |
| CN | 104596677 | A | 5/2015 |
| DE | 69912589 | T2 | 9/2004 |
| DE | 102014112639 | A1 | 3/2016 |
| DE | 202014106213 | U1 | 3/2016 |
| EP | 1422020 | A1 | 5/2004 |
| EP | 2002945 | A1 | 12/2008 |
| EP | 2114631 | A2 | 11/2009 |
| JP | S 61-57866 | A | 3/1986 |
| JP | H 02-138884 | A | 5/1990 |
| JP | H07314262 | A | 12/1995 |
| JP | 08-052673 | A | 2/1996 |
| JP | H 11-6856 | A | 1/1999 |
| JP | H116856 | A | 1/1999 |
| JP | H 11-030643 | A | 2/1999 |
| JP | UP 2002-507753 | A | 3/2002 |
| JP | 2003-017209 | A | 1/2003 |
| JP | 2004-167651 | A | 6/2004 |
| JP | 2004-255490 | A | 9/2004 |
| JP | 2007-522451 | A | 8/2007 |
| JP | 2012-027607 | A | 2/2012 |
| JP | 2014-184517 | A | 10/2014 |
| JP | 2015-085494 | A | 5/2015 |
| JP | 2015-168017 | A | 9/2015 |
| JP | 2016-203280 | A | 12/2016 |
| WO | WO 2006100940 | A1 | 9/2006 |
| WO | WO 2008/085937 | A2 | 7/2008 |
| WO | 2012004017 | A1 | 1/2012 |

OTHER PUBLICATIONS

Sure Controls: "Sawyer Rethink Robotics PCB Handling ICT", YouTube (Apr. 22, 2016) [XP054978497],Jul. 2018: URL:https://www.youtube.com/watch?v=nnzmxJS4Rp4.

English Translation of the International Preliminary Report on Patentability issued in International Application No. PCT/EP2018/059872 dated Nov. 7, 2019.

\* cited by examiner

DEVICE AND METHOD FOR THE ELECTRICAL TESTING OF AN ELECTRICAL COMPONENT

CROSS-REFERENCE TO RELATED APPLICATIONS

The present application is the U.S. National Phase of PCT/EP2018/059872, filed on 18 Apr. 2018, which claims priority to German Patent Application No. 10 2017 003 901.1, filed on 23 Apr. 2017, the entire contents of which are incorporated herein by reference.

BACKGROUND

The invention relates to a device and a method for the electrical testing of an electrical component. The term "electrical component" is understood to be defined in wide terms here. It covers all objects which including electrical contacts, electrical conductors, electrical conductor lines, electrical devices, electrical component groups, etc., for example.

SUMMARY

The object of the invention is to provide a device and a method for the electrical testing of an electrical component which make the electrical testing more effective, more reliable, and consequently more energy-efficient.

The invention will become apparent from the features of the independent claims. Advantageous further developments and embodiments are the subject matter of the dependent claims. Other features, possible applications and advantages of the invention will become apparent from the following description, as well as the explanation of example embodiments of the invention shown in the figures.

A first aspect of the invention relates to a device for the electrical testing of an electrical component, the electrical component including at least one electrical contact point. Electrical contacts are plugs, sockets, electrical contact points, etc., for example. The device further includes an interface for providing the electrical component. This interface may be a box, a shelf, a bracket, or a pallet, for example, on/in which the one component or multiple components are provided. The provision of the component at the interface can also advantageously be actively done mechanically. In this case, a component is advantageously actively "held" in a specific orientation at the interface. The interface is then preferably designed as a robot manipulator which provides the component at a specific position in a specific orientation by means of its effector.

The device further includes a first robot manipulator having an effector, which is configured and constructed for picking up, handling and releasing the electrical component. Robot manipulators with relevant mechanical effectors are sufficiently known in the state of the art. The first robot manipulator may in particular also be part of another system, for example, a humanoid robot.

The device further includes a mechanical receiving interface into which the electrical component can be inserted. This receiving interface is advantageously designed as a recess or trough having geometry which matches that of the electrical component. The component can advantageously be fixed into the mechanical receiving interface after insertion, for example, through the use of an appropriate spring mechanism which holds the inserted component into the receiving interface. The device further includes a contacting device having at least one movable electrical counter contact, wherein the contacting device is positioned in a first state in such a manner that space is available for the first robot manipulator to be able to insert/remove the electrical component into/from the receiving interface, and wherein the contacting device and, in particular, the counter contact is positioned in a second state in such a manner that the at least one counter contact is connected to the contact point of the electrical component which has been inserted into the receiving interface. In one design, the contacting device includes the receiving interface.

The suggested device further includes an analysis unit connected to the at least one counter contact, the analysis unit being configured and constructed to perform electrical testing of the component using the electrical connection of counter contact and contact point, i.e. with the existence of an electrical connection between the component and the analysis unit, in the second state and to provide and/or output a test result. During the electrical testing, electrical voltages, electrical currents, time response, electrical signals and signal characteristics, signal responses from the component, etc. are recorded and analyzed. The electrical testing is, in particular, used for quality control and/or functional testing of the respective electrical component.

Finally, the device includes a control unit for the automated control of the first robot manipulator and the contacting device. The contacting device is advantageously driven by an actuator in order to be moved from the first state to the second state and vice versa. Of course, devices for the electrical testing of components with a passive design, i.e. that have no actuators which actively establish the first and second state, can also be used in principle. For this type of use case, the contacting device is advantageously transferred from the first state to the second state and vice versa by the robot manipulator. To this end, the robot manipulator moves a corresponding flap, for example, on which the at least one counter contact is arranged from one position to the other, wherein one of the positions denotes the first state and the second position denotes the second state.

An advantageous further development of the device is characterized in that the control unit is designed as a variant from the following list:
- As a central control unit for joint, e.g. coordinated control/regulation of the first robot manipulator and the contacting device and the analysis unit,
- Having a first sub-control unit solely for the control/regulation of the first robot manipulator and a second sub-control unit for the coordinated control/regulation of the contacting device and the analysis unit,
- Having a first sub-control unit solely for the control/regulation of the first robot manipulator and a third sub-control unit solely for the coordinated control/regulation of the contacting device and a fourth sub-control unit for the control/regulation of the analysis unit.

An advantageous further development of the device is characterized in that the control unit is configured and constructed to execute the following first control program. The first control program is characterized in that in the first state the first robot manipulator is controlled such that the first robot manipulator picks the electrical component up from the interface with the effector and carries the electrical component along a predefined trajectory with a target orientation $O_{soll}(R_T)$ to the receiving interface, wherein a target orientation $O_{soll}(R_T)$ is defined for the component along the trajectory T for positions $R_T$ of the trajectory T, wherein force controlled and/or impedance controlled rotational movement and/or tilting movements and/or translational movement patterns of the electrical component and/or desired force screw patterns of the electrical component are made for the insertion of the component into the receiving interface by the first robot manipulator, until a predefined limit value state G1 for a torque acting on the effector and/or a predefined limit value state G2 for a force acting on the effector is reached or exceeded and/or an allocated force/torque signature and/or a position/speed signature is reached or exceeded on the effector, which indicates/indicate that the insertion of the electrical component into the receiving interface within predefined tolerances has been successfully completed.

The term "signature" here describes a predefined parameter data set with assigned values and/or interval limits and/or a predefined time response of a predefined parameter data set for identification of the successful completion of the insertion of the electrical component into the receiving interface. The signature thus describes a combination of parameters and/or their time responses. Thus, for example, a predefined force-time response may define the successful completion of the insertion of the electrical component.

The tilting movements of the component are advantageously periodic and/or closed movements in all cases in this description. The tilting movements are advantageously made relative to the target orientation $O_{soll}(R_T)$ of the component. The tilting movements advantageously occur around one, two or three tilt axes. A "closed" tilting movement is understood here to mean a movement in which an initial orientation $O(t_0)$ of the component is modified by the tilting movements, and this orientation exists once again after a time $\Delta t$: $O(t_1)=O(t_0)$, where $t_0<t_1$, $t_1=t_0+\Delta t$.

Depending on the use case, the rotational and/or tilting movements may also be aperiodic movements or a combination of aperiodic and periodic movements.

The rotational and/or tilting movements are most preferably carried out continuously during insertion of the component into the receiving interface.

The control unit is advantageously configured and constructed to execute the following second control program: in the first state, the first robot manipulator is controlled such that the electrical component is released by the effector (mechanically released) after successful completion of insertion of the electrical component into the receiving interface and the effector is moved away from the receiving interface by the first robot manipulator along the predefined end trajectory A.

The control unit is advantageously configured and constructed to execute the following third control program: the first robot manipulator is controlled/regulated such that the first robot manipulator causes the effector to make force controlled and/or impedance controlled rotational and/or tilting movements (relative to a predefined target orientation of the effector) and translational movement patterns of the effector. This facilitates the separation between the effector and the electrical component.

The control unit is advantageously configured and constructed to execute the following fourth control program: in the first state, the robot manipulator is controlled such that an electrical component inserted into the receiving interface is picked up by the effector after completion of electrical testing of the component in the second state and carried from the receiving interface along a predefined end trajectory B to a predefined set-down position by the first robot manipulator and released there.

The contacting device advantageously includes a second force controlled and/or impedance controlled and/or admittance controlled robot manipulator, wherein the at least one electrical counter contact is arranged on the effector of the second robot manipulator.

The contacting device is advantageously mechanically rigidly connected to the second robot manipulator.

The analysis unit is advantageously configured and constructed to measure electrical signals from the electrical component via the electrical connection between the counter contact and the contact point and to compare them with predefined target information, and to provide and/or output the comparison result thus achieved as the test result.

The electrical component may be an individual electrical component, for example a capacitor, an inductor or a resistor, a printed circuit board equipped with multiple electrical components, a bare printed circuit board, or a complete electrical device (for example, a smartphone, an amplifier, a radio, etc.).

The at least one electrical contact point and the at least one counter contact are advantageously implemented as multipole contacts. A variety of complex electrical analyses and tests can thus be performed on the component.

An advantageous further development of the device is characterized in that the control unit is configured and constructed to execute the following fifth control program: wherein the first robot manipulator makes the tilting movements of the electrical component relative to its target orientation $O_{soll}(R_T)$ on one, two or three tilt axes, wherein the tilt angle is in an angle range of up to $\pm 1°$, $\pm 2°$, $\pm 5°$, $\pm 7°$, $\pm 10°$, $\pm 12°$, $\pm 15°$ to a target orientation $O_{soll}(\vec{R}_T)$. The rotational movements are advantageously periodically performed, i.e. a left-hand rotation is followed by a right-hand movement, wherein the angle of rotation is advantageously identical in each case. The rotational movements advantageously follow a rotation range of: $\pm 1°$, $\pm 2°$, $\pm 5°$, $\pm 7°$, $\pm 10°$, $\pm 12°$, $\pm 15°$.

An advantageous further development of the device is characterized in that the control unit is configured and constructed to execute the following sixth control program: the first robot manipulator is controlled for insertion of the component into the receiving interface such that the component makes translational, periodical and, in particular, continuous movements.

An advantageous further development of the device is characterized in that the control unit is configured and constructed to execute the following eighth control program: the first robot manipulator is controlled such that if an error occurs during component pick-up by the effector, component pick-up by the effector is repeated with modified parameters for pick-up/gripping of the component.

An advantageous further development of the device is characterized in that the control unit is configured and constructed to execute the following ninth control program: the first robot manipulator is controlled such that if an error occurs during insertion of the electrical component into the receiving interface, insertion of the electrical component into the receiving interface is repeated with modified parameters.

An advantageous further development of the device is characterized in that the device includes a data interface to a data network, for example the World Wide Web or a local data network, and the device is configured and constructed to load control programs for the control unit from the data network.

An advantageous further development of the device is characterized in that the device is configured and constructed to load control and regulation parameters for one or more of the control programs (one to nine) from the data network.

An advantageous further development of the device is characterized in that the device is configured and constructed to load control and regulation parameters for one or more of the control programs via a local interface and/or by means of a teach-in process, wherein the robot manipulator is guided manually for the latter.

An advantageous further development of the device is characterized in that the device is configured and constructed such that the loading of control programs and/or of the associated control and regulation parameters from the data network is controlled by a remote station which is likewise connected to the data network.

An advantageous further development of the device is characterized in that the device is configured and constructed to send control programs and/or the associated control and regulation parameters which are available locally on the device to other similar devices and/or other users upon request or actively via the data network.

An advantageous further development of the device is characterized in that the device is configured and constructed such that control programs with the associated control and regulation parameters are started from a remote station which is likewise connected to the data network.

An advantageous further development of the invention is characterized in that the remote station and/or the local interface includes a man-machine interface (MMI) which is configured and constructed for the entry of control programs and/or the associated control and regulation parameters, and/or for the selection of control programs and/or the associated control and regulation parameters from a variety of available control programs and/or associated control and regulation parameters.

An advantageous further development of the invention is characterized in that the man-machine interface (MMI) allows entries via a "drag and drop" input on a touchscreen, a guided input dialog, a keyboard, a computer mouse, a haptic input interface, virtual reality glasses, an acoustic input interface, object tracking, on the basis of electromyographic data, on the basis of electroencephalographic data, via a neural interface with the brain or a combination of the above.

An advantageous further development of the invention is characterized in that the man-machine interface is configured and constructed to output audiovisual, haptic, olfactory, tactile, electrical feedback or a combination of the above.

A further aspect of the invention relates to a method for the electrical testing of an electrical component, the electrical component including at least one electrical contact point, having the following steps.

Provision of the electrical component at an interface is done in a first step.

Pick-up of the electrical component at the interface is done in a second step by an effector of a first robot manipulator.

Carrying of the component by the first robot manipulator along a predefined trajectory to a receiving interface is done in a third step, wherein a target orientation $O_{soll}(R_T)$ is defined for the component along the trajectory T for positions $R_T$ of the trajectory T.

Insertion of the component into the receiving interface is done in a fourth step by the first robot manipulator, wherein the first robot manipulator makes force controlled and/or impedance controlled and/or admittance controlled rotational movements and/or tilting movements and/or translational movement patterns and/or desired force screw patterns, until a predefined limit value state G1 for a torque acting on the effector of the first robot manipulator (102a) and/or a predefined limit value state G2 for a force acting on the effector is reached or exceeded and/or an allocated force/torque signature and/or a position/speed signature is reached or exceeded on the effector, which indicates/indicate that the insertion of the electrical component into the receiving interface within predefined tolerances has been successfully completed.

Establishment of an electrical contact between the contact point on the component and an electrical counter contact which is arranged on a contacting device is done in a fifth step by an analysis unit connected to the counter contact.

Execution of electrical testing of the component and provision and/or output of a test result is done in a sixth step.

Pick-up of the electrical component inserted into the receiving interface is done in a seventh step by the first robot manipulator.

Carrying of the component by the robot manipulator from the receiving interface to a predefined set-down position and release of the component at the set-down position is done in an eighth step.

An advantageous further development of the method is characterized in that the electrical component is released by the effector of the first robot manipulator after successful completion of insertion of the electrical component into the receiving interface and the effector is moved away from the receiving interface by the first robot manipulator along the predefined end trajectory A.

An advantageous further development of the method is characterized in that an electrical component inserted into the receiving interface is picked up by the effector after completion of electrical testing of the component in the second state and carried from the receiving interface along a predefined end trajectory B to a predefined set-down position by the first robot manipulator and released there.

An advantageous further development of the method is characterized in that the analysis unit measures electrical signals from the electrical component via the electrical connection between the counter contact and the contact point and compares them with predefined target states, and provides and/or outputs the comparison result thus achieved as the test result.

An advantageous further development of the method is characterized in that the first robot manipulator releases the component with force controlled and/or impedance controlled rotational movements and/or tilting movements of the electrical component. The rotational/tilting movements preferably occur continuously and/or periodically here.

An advantageous further development of the method is characterized in that the first robot manipulator is controlled for the insertion of the component into the receiving interface such that the component makes translational, periodical movements perpendicular to its target orientation $O_{soll}(R_T)$. The translational movements preferably occur continuously.

An advantageous further development of the method is characterized in that the first robot manipulator makes the tilting movements of the electrical component relative to its target orientation $O_{soll}(R_T)$ on one, two or three axes to its target orientation $O_{soll}(\vec{R}_T)$, wherein the tilt angle is in an angle range of up to ±1°, ±2°, ±5°, ±7°, ±10°, ±12°, ±15° to the target orientation $O_{soll}(\vec{R}_T)$. The rotational movements are advantageously periodically performed, i.e. a left-hand rotation is followed by a right-hand movement, wherein the angle of rotation is advantageously identical in each case.

The rotational movements advantageously follow a rotation range of: ±1°, ±2°, ±5°, 7°, ±10°, ±12°, ±15°.

An advantageous further development of the method is characterized in that the first robot manipulator is controlled such that if an error occurs during component pick-up (gripping) by the effector, component pick-up (gripping) by the effector is repeated with modified parameters for pick-up/gripping of the component.

An advantageous further development of the method is characterized in that the respective device includes a data interface to a data network, and the device is configured and constructed to load one or more control programs from the data network.

An advantageous further development of the method is characterized in that the respective device loads control and regulation parameters for control programs from the data network.

An advantageous further development of the method is characterized in that the respective device loads control and regulation parameters for the control programs locally available on the device via a local input interface and/or via a teach-in process in which the first and/or second or third robot manipulators are guided manually.

An advantageous further development of the method is characterized in that the loading of control programs and/or of the associated control and regulation parameters onto the respective device from the data network is controlled by a remote station which is likewise connected to the data network.

An advantageous further development of the method is characterized in that control programs which are available locally on the device with the associated control and regulation parameters are started from a remote station which is likewise connected to the data network.

A further aspect of the invention relates to a computer system having a data processing apparatus, wherein the data processing apparatus is designed such that a method, as described above, is executed on the data processing apparatus.

Another aspect of the invention relates to digital storage medium having electronically readable control signals, wherein the control signals can interact with a programmable computer system in such a way that a method, as described above, is executed.

Another aspect of the invention relates to a computer program product having a program code for executing the method, as described above, stored on a machine-readable medium, if the program code is executed on a data processing apparatus.

Another aspect of the invention relates to a computer program having program codes for executing the method, as described above, if the program runs on a data processing apparatus. For this purpose, the data processing apparatus can be designed as any known computer system known from the state of the art.

Other advantages, features and details will become apparent from the following description, in which at least one example embodiment is described in detail, with reference to the drawing, if applicable. Identical, similar, and/or functionally identical parts have the same reference numerals.

DETAILED DESCRIPTION

Figure 1:
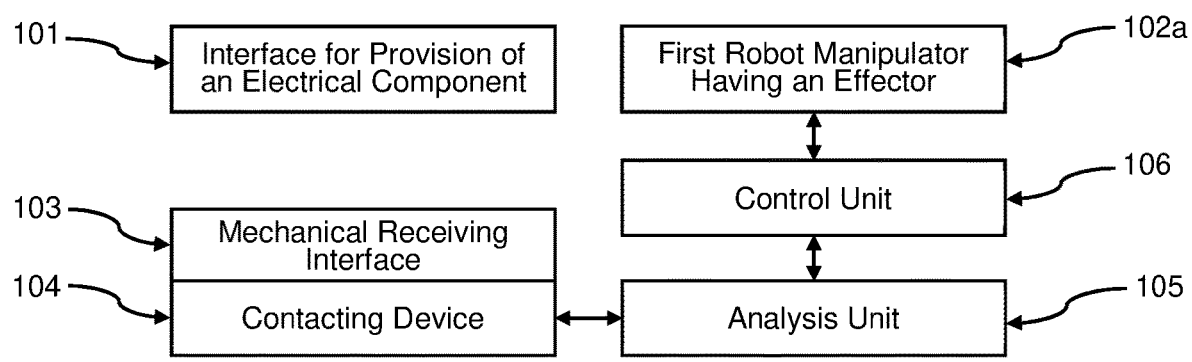
FIG. 1 shows a highly schematic representation of the suggested device.

FIG. 1 shows a highly schematic representation of the suggested device for the electrical testing of an electrical component, wherein the electrical component includes at least one electrical contact point, the device including an interface 101 for provision of the electrical component, a first robot manipulator 102a having an effector which is configured and constructed for picking up, handling and releasing the electrical component, a mechanical receiving interface 103 into which the electrical component can be inserted, a contacting device 104 having at least one electrical counter contact, wherein the contacting device 104 is positioned in a first state in such a manner that space is available for the first robot manipulator 102a to be able to insert/remove the electrical component into/from the receiving interface, and the contacting device 104 is positioned in a second state in such a manner that the at least one counter contact is connected to the contact point of the electrical component which has been inserted into the receiving interface, an analysis unit 105 connected to the counter contact, wherein the analysis unit 105 is configured and constructed to perform electrical testing of the component using the electrical connection of counter contact and contact point in the second state and to provide and/or output a test result, and a control unit 106 for the automated control of the first robot manipulator 102a and the contacting device 104.

Figure 2:
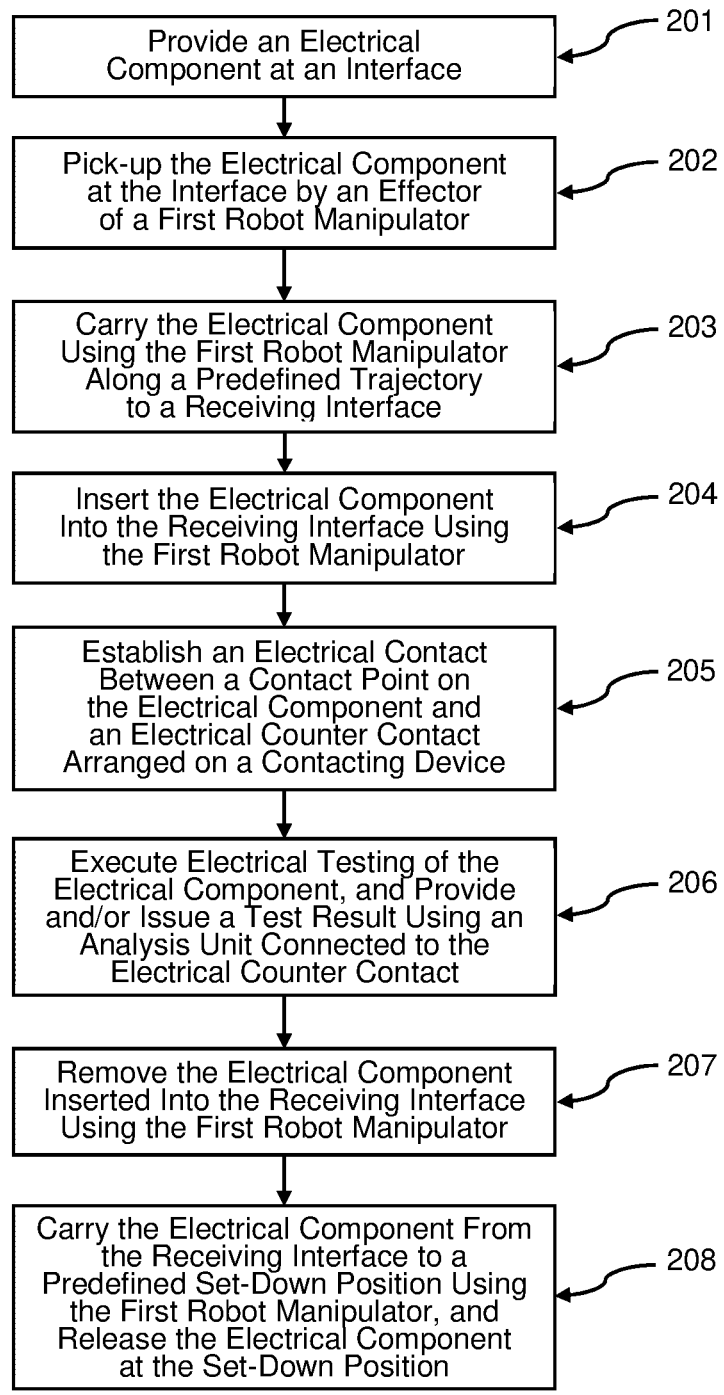
FIG. 2 shows a highly schematic representation of a suggested method.

FIG. 2 shows highly schematic representation of a method for the electrical testing of an electrical component, the electrical component including at least one electrical contact point, having the following steps.

Provision of the electrical component at an interface 101 is done in step 201.

Pick-up of the electrical component at the interface 101 is done in step 202 by an effector of a first robot manipulator 102a.

Carrying of the component is done in step 203 by the first robot manipulator 102a along a predefined trajectory to a receiving interface 103, wherein a target orientation $O_{soll}(R_T)$ is defined for the component along the trajectory T for positions $R_T$ of the trajectory T.

Insertion of the component into the receiving interface 103 by the first robot manipulator 102a is done in step 204, wherein the first robot manipulator 102a makes force controlled tilting movements of the electrical component relative to its target orientation $O_{soll}(R_T)$ during insertion of the component into the receiving interface 103, until a predefined limit value state G1 for a torque acting on the effector of the first robot manipulator 102a and/or a predefined limit value state G2 for a force acting on the effector is reached or exceeded and/or an allocated force/torque signature and/or a position/speed/acceleration signature is reached or exceeded on the effector, which indicates/indicate that the insertion of the electrical component into the receiving interface 103 within predefined tolerances has been successfully completed.

Establishment of an electrical contact between the contact point on the component and an electrical counter contact which is arranged on a contacting device 104 is done in step 205.

Execution of electrical testing of the components and provision and/or issuing of a test result by means of an analysis unit 105 connected to the counter contact is done in step 206. The electrical testing includes analysis of the functionality of the component, analysis of compliance with predefined tolerances, reading and analysis of an error memory of the component (where available), etc. Depending on the complexity of the electrical component, very complex analyses may be performed in some instances and corresponding test results may be generated.

Pick-up of the electrical component inserted into the receiving interface 103 is done in step 207 by the first robot manipulator 102a.

Carrying of the component by the robot manipulator 102a from the receiving interface 103 to a predefined set-down position and release of the component at the set-down position is done in step 208.

Although the invention has been illustrated and explained in detail through preferred example embodiments, the invention is not limited by the disclosed examples and other variations may be derived by persons skilled in the art without departing from the scope of protection of the invention. It is therefore clear that multiple possible variations exist. It is likewise clear that example embodiments cited by way of illustration are merely examples, which are not taken in any way as a limitation regarding the scope of protection, the possible applications, or the configuration of the invention. Rather, the above description and the description of the figures enable the person skilled in the art to concretely implement the example embodiments, wherein the person skilled in the art, in the knowledge of the disclosed inventive concept, can make numerous changes, for example, with respect to the function or the arrangement of individual elements, mentioned in an example embodiment, without departing from the scope defined by the claims and their legal equivalences, such as further explanations in the description.

The invention claimed is:

1. A device for electrical testing of an electrical component, wherein the electrical component comprises at least one electrical contact point, the device comprising:
   an interface to provide the electrical component;
   a first robot manipulator having an effector, the effector configured and constructed to pick up, handle, and release the electrical component;
   a mechanical receiving interface into which the electrical component is insertable;
   a contacting device having at least one electrical counter contact, the contacting device being positioned in a first state in such a manner that space is available for the first robot manipulator to be able to insert the electrical component into or remove the electrical component from the receiving interface, and the contacting device being positioned in a second state in such a manner that the at least one counter contact is connected to the at least one contact point of the electrical component which has been inserted into the receiving interface;
   an analysis unit connected to the at least one counter contact, the analysis unit being configured and constructed to perform electrical testing of the electrical component using electrical connection of the at least one counter contact and the at least one contact point in the second state and to provide and/or output a test result; and
   a control unit for automated control of the first robot manipulator and the contacting device.

2. The device according to claim 1, wherein the control unit is designed as a variant selected from the following list:
   as a central control unit for control or regulation of the first robot manipulator and the contacting device and the analysis unit;
   as a first sub-control unit for control or regulation of the first robot manipulator and a second sub-control unit for coordinated control or regulation of the contacting device and the analysis unit; and
   as a first sub-control unit for control or regulation of the first robot manipulator and a third sub-control unit for coordinated control or regulation of the contacting device and a fourth sub-control unit for the control or regulation of the analysis unit.

3. The device according to claim 1, wherein the control unit is configured and constructed to execute one or more control programs to perform operations comprising:
   controlling the first robot manipulator in the first state such that the first robot manipulator picks up the electrical component from the interface using the effector and carries the electrical component along a predefined trajectory with a target orientation $O_{soll}(R_T)$ to the receiving interface, wherein the target orientation $O_{soll}(R_T)$ is defined for the electrical component along the trajectory T for positions $R_T$ of the trajectory T; and
   performing force controlled and/or impedance controlled and/or admittance controlled rotational movement and/or tilting movements and/or translational movement patterns and/or desired force screw patterns for the insertion of the electrical component into the receiving interface by the first robot manipulator, until a predefined limit value state G1 for a torque acting on the effector and/or a predefined limit value state G2 for a force acting on the effector is reached or exceeded, and/or an allocated force/torque signature and/or a position/speed/acceleration signature is reached or exceeded on the effector, indicating that the insertion of the electrical component into the receiving interface (103) within predefined tolerances has been successfully completed.

4. The device according to claim 3, wherein the operations further comprise:
   controlling the first robot manipulator in the first state such that the electrical component is released by the effector after successful completion of insertion of the electrical component into the receiving interface, and the effector is moved away from the receiving interface by the first robot manipulator along the predefined end trajectory A.

5. The device according to claim 4, wherein the operations further comprise:
   controlling the first robot manipulator such that the first robot manipulator causes the effector to make force controlled and/or impedance controlled and/or admittance controlled rotational and/or tiling movement and/or translational movement patterns after releasing the electrical component.

6. The device according to claim 3, wherein the operations further comprise:
   controlling the first robot manipulator to make the tilting movements of the electrical component relative to its target orientation $O_{soll}(R_T)$ on one, two or three tilt axes, wherein a tilt angle is in an angle range of up to ±1°, ±2°, ±5°, ±7°, ±10°, ±12°, ±15° to a target orientation $O_{soll}(\vec{R}_T)$.

7. The device according to claim 1, wherein the control unit is configured and constructed to execute one or more control programs to perform operations comprising:
   controlling the first robot manipulator in the first state such that the electrical component inserted into the receiving interface is picked up by the effector after completion of electrical testing of the electrical component in the second state, and carried from the receiving interface along a predefined end trajectory B to a predefined set-down position by the first robot manipulator and released there.

8. The device according to claim 1, wherein the contacting device comprises a second robot manipulator that is force controlled and/or impedance controlled and/or admittance controlled, wherein the at least one electrical counter contact is arranged on a second effector of the second robot manipulator.

9. The device according to claim 1, wherein the analysis unit is configured and constructed to measure electrical signals from the electrical component via the electrical connection between the at least one counter contact and the at least one contact point, to compare the electrical signals with predefined target information, and to provide and/or output a comparison result thus achieved as the test result.

10. The device according to claim 1, wherein the device comprises a data interface to a data network, and the device is configured and constructed to load control programs from the data network.

11. The device according to claim 1, wherein the device is configured and constructed to load control and regulation parameters for control programs from the data network.

12. A method of electrical testing of an electrical component, wherein the electrical component comprises at least one electrical contact point, the method comprising:
  providing the electrical component at an interface;
  picking-up the electrical component at the interface using an effector of a first robot manipulator;
  carrying the component using the first robot manipulator along a predefined trajectory to a receiving interface, wherein a target orientation $O_{soll}(R_T)$ is defined for the electrical component along a trajectory T for positions $R_T$ of the trajectory T;
  inserting the electrical component into the receiving interface using the first robot manipulator, wherein the first robot manipulator makes force controlled and/or impedance controlled and/or admittance controlled rotational and/or tilting movements of the electrical component and/or translational movement patterns and/or desired force screw patterns of the electrical component during insertion of the electrical component into the receiving interface, until a predefined limit value state G1 for a torque acting on the effector of the first robot manipulator and/or a predefined limit value state G2 for a force acting on the effector is reached or exceeded, and/or until an allocated force/torque signature and/or a position/speed/acceleration signature is reached or exceeded on the effector, indicating that the insertion of the electrical component into the receiving interface within predefined tolerances has been successfully completed;
  establishing an electrical contact between the at least one contact point on the component and at least one electrical counter contact arranged on a contacting device;
  executing electrical testing of the electrical component and providing and/or issuing a test result using an analysis unit connected to the at least one counter contact; and
  removing the electrical component inserted into the receiving interface using the first robot manipulator, carrying the component from the receiving interface to a predefined set-down position by the first robot manipulator, and releasing the component at the set-down position.

13. A computer system for electrical testing of an electrical component, wherein the electrical component comprises at least one electrical contact point, the system comprising:
  a data processing apparatus; and
  a machine-readable storage medium storing instructions that, when executed by the data processing apparatus, cause the data processing apparatus to perform operations comprising:
    providing the electrical component at an interface;
    picking-up the electrical component at the interface using an effector of a first robot manipulator;
    carrying the component using the first robot manipulator along a predefined trajectory to a receiving interface, wherein a target orientation $O_{soll}(R_T)$ is defined for the electrical component along a trajectory T for positions $R_T$ of die trajectory T;
    inserting the electrical component into the receiving interface using the first robot manipulator, wherein the first robot manipulator makes force controlled and/or impedance controlled and/or admittance controlled rotational and/or tilting movements of the electrical component and/or translational movement patterns and/or desired force screw patterns of the electrical component during insertion of the electrical component into the receiving interface, until a predefined limit value state G1 for a torque acting on the effector of the first robot manipulator and/or a predefined limit value state G2 for a force acting on the effector is reached or exceeded, and/or until an allocated force/torque signature and/or a position/speed/acceleration signature is reached or exceeded on the effector, indicating that the insertion of the electrical component into the receiving interface within predefined tolerances has been successfully completed;
    establishing an electrical contact between the at least one contact point on the component and at least one electrical counter contact arranged on a contacting device;
    executing electrical testing of the electrical component and providing and/or issuing a test result using an analysis unit connected to the at least one counter contact; and
    removing the electrical component inserted into the receiving interface using the first robot manipulator, carrying the component from the receiving interface to a predefined set-down position by the first robot manipulator, and releasing the component at the set-down position.

14. A non-transitory machine-readable storage medium storing instructions for electrical testing of an electrical component, wherein the electrical component comprises at least one electrical contact point, the instructions, when executed by a data processing apparatus, cause the data processing apparatus to perform operations comprising:
  providing the electrical component at an interface;
  picking-up the electrical component at the interface using an effector of a first robot manipulator;
  carrying the component using the first robot manipulator along a predefined trajectory to a receiving interface, wherein a target orientation $O_{soll}(R_T)$ is defined for the electrical component along a trajectory T for positions $R_T$ of the trajectory T;
  inserting the electrical component into the receiving interface using the first robot manipulator, wherein the first robot manipulator makes force controlled and/or impedance controlled and/or admittance controlled rotational and/or tilting movements of the electrical component and/or translational movement patterns and/or desired force screw patterns of the electrical component during insertion of the electrical component into the receiving interface, until a predefined limit value state G1 for a torque acting on the effector of the first robot manipulator and/or a predefined limit value state G2 for a force acting on the effector is reached or exceeded, and/or until an allocated force/torque signature and/or a position/speed/acceleration signature is reached or exceeded on the effector, indicating that the insertion of the electrical component into the receiving interface within predefined tolerances has been successfully completed;

establishing an electrical contact between the at least one contact point on the component and at least one electrical counter contact arranged on a contacting device;

executing electrical testing of the electrical component and providing and/or issuing a test result using an analysis unit connected to the at least one counter contact; and removing the electrical component inserted into the receiving interface using the first robot manipulator, carrying the component from the receiving interface to a predefined set-down position by the first robot manipulator, and releasing the component at the set-down position.

* * * * *